United States Patent
Noguchi et al.

(10) Patent No.: US 8,441,277 B2
(45) Date of Patent: May 14, 2013

(54) SEMICONDUCTOR TESTING DEVICE, SEMICONDUCTOR DEVICE, AND TESTING METHOD

(75) Inventors: Koichiro Noguchi, Tokyo (JP); Yoshio Kameda, Tokyo (JP); Koichi Nose, Tokyo (JP); Masayuki Mizuno, Tokyo (JP); Toshinobu Ono, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 345 days.

(21) Appl. No.: 12/810,877

(22) PCT Filed: Dec. 16, 2008

(86) PCT No.: PCT/JP2008/072834
§ 371 (c)(1),
(2), (4) Date: Jul. 20, 2010

(87) PCT Pub. No.: WO2009/084424
PCT Pub. Date: Jul. 9, 2009

(65) Prior Publication Data
US 2010/0283497 A1    Nov. 11, 2010

(30) Foreign Application Priority Data

Dec. 28, 2007  (JP) ................................. 2007-340376
Sep. 24, 2008  (JP) ................................. 2008-244307

(51) Int. Cl.
*G01R 31/26*    (2006.01)
(52) U.S. Cl.
USPC .................................................. 324/762.01
(58) Field of Classification Search .. 324/762.01–762.1, 324/750.01–750.3; 257/48; 438/14–18
See application file for complete search history.

(56) References Cited

U.S. PATENT DOCUMENTS

| | | | |
|---|---|---|---|
| 5,894,213 A | 4/1999 | Nakamura | |
| 6,437,589 B1* | 8/2002 | Sugano | 324/750.3 |
| 6,650,136 B2* | 11/2003 | Babella et al. | 324/762.02 |

FOREIGN PATENT DOCUMENTS

| | | |
|---|---|---|
| JP | 05-060835 | 3/1993 |
| JP | 10-111346 | 4/1998 |
| JP | 10-170608 | 6/1998 |
| JP | 10-339762 | 12/1998 |
| JP | 11-083950 | 3/1999 |
| JP | 2002-124852 | 4/2002 |

(Continued)

OTHER PUBLICATIONS

International Search Report, PCT/JP2008/072834, Apr. 7, 2009.

*Primary Examiner* — Tung X Nguyen
(74) *Attorney, Agent, or Firm* — Young & Thompson

(57) ABSTRACT

A semiconductor test apparatus, semiconductor device, and test method are provided that enable the realization of a high-speed delay test. Semiconductor test apparatuses (1a-1c) include: flip-flops (11) each provided with first input terminal SI, second input terminal D, mode terminal SE that accepts a mode signal indicating either a first mode or a second mode, clock terminal CK that accepts a clock signal, and output terminal Q, the flip-flops (11) selecting first input terminal SI when the mode signal indicates the first mode, selecting second input terminal D when the mode signal indicates the second mode, and holding information being received by the input terminal that was selected based on the mode signal in synchronization with the clock signal and supplying as output from output terminal Q; and hold unit 12 that holds a set value and that provides the set value to first input terminal SI.

14 Claims, 14 Drawing Sheets

FOREIGN PATENT DOCUMENTS

| | | |
|---|---|---|
| JP | 2003-344491 | 12/2003 |
| JP | 2004-170244 | 6/2004 |
| JP | 2004-361351 | 12/2004 |
| JP | 2005-181261 | 7/2005 |
| JP | 2006-084403 | 3/2006 |
| JP | 2006-308302 | 11/2006 |
| JP | 2007-187458 | 7/2007 |

* cited by examiner

SEMICONDUCTOR TESTING DEVICE, SEMICONDUCTOR DEVICE, AND TESTING METHOD

TECHNICAL FIELD

The present invention relates to a semiconductor test apparatus, a semiconductor device, and a test method.

BACKGROUND ART

Testing for judging whether semiconductor devices (for example, LSI: Large Scale Integration) are operating correctly is an indispensable technology at the product shipment stage and in fabrication stages such as fault analysis.

As one typical test of this type, a low-speed test method has been used for detecting "stuck-at faults" in which a signal degenerates to "0" or "1" due to a short fault or due to an open fault of a signal line.

However, the increased operating speed of LSI that has accompanied the miniaturization of LSI in recent years has led to an increase in delay faults that cannot be detected by a low-speed test method. A delay fault is a fault in which a signal change is not passed between flip-flops (hereinbelow abbreviated as "FF") within a prescribed time interval.

When testing LSI, a test pattern is typically applied as input from the outside and analysis is then carried out regarding whether the LSI output signal matches an expected value.

The simplest method of observing the state of an LSI is a method of supplying the signal of a node that is to be observed to the chip exterior by way of an external output pin of the LSI. However, the number of external output pins of an LSI is typically less than the number of all internal nodes, and it is therefore impossible to extract the signals of all internal nodes to the outside by way of the external output pins of the LSI.

A scanning method is therefore considered as a method of raising observation capabilities.

In a scanning method, the FFs in a circuit are replaced by scan flip-flops (hereinbelow abbreviated as "scan FF") and the scan FFs are connected in series.

A scan FF includes a data input terminal that accepts a signal from the logic circuit that is the test-object, a scan-in terminal that accepts the test pattern, a mode terminal that accepts a mode signal, a clock terminal, and an output terminal, and further includes a test mode and a normal mode. The test pattern is made up from an initial value that is set to each scan FF.

When the mode signal indicates the test mode, each of the scan FFs that are connected in series: operates as a shift register; accepts input from, of the data input terminal and scan-in terminal, the scan-in terminal; and sets (scans in) the state of the circuit interior (its own circuit interior) based on the instructions applied as input to the scan-in terminal (an initial value among the test pattern that corresponds to itself). In addition, in the test mode, the scan FF supplies (scans out) to the outside the state of the circuit interior (its own circuit interior).

When the mode signal indicates the normal mode, the scan FF accepts, from among the data input terminal and the scan-in terminal, input (the signal from the logic circuit that is the test-object) from the data input terminal, and operates as a normal FF to implement testing of the logic circuit.

In a delay test, analysis is carried out between two FFs in a circuit to determine if the circuit operation brought about by a signal supplied from one of the FFs is latched within a prescribed time interval by the other FF. The scan method is also effective in a delay test as a method of setting the initial value of the FFs in a circuit and observing the test results. The scan method is widely used for this reason.

In a delay test that uses the scan method, a scan FF is first operated in the test mode, and the state of the scan FF is set to any (specifically, an initial value included in the test pattern) based on the test pattern from the scan-in terminal. At this time, the output of the scan FF is the initial value.

The scan FF is next set to the normal mode, whereby the input from the data input terminal comes into effect. A scan FF in the normal mode carries out normal operations at a particular test frequency and carries out the operation test of a logic circuit in the interval of exactly two clocks. At this time, a signal transition is brought about by the first clock in the scan FF and this signal transition is applied as input to the logic circuit. The operation result of the logic circuit is latched in the scan FF at the next clock.

The scan FF is next set to the test mode again. Each scan FF in the test mode operates as a shift register, and the latched results are supplied to the chip exterior in accordance with the input of a clock. Determining whether the results are correct is carried out based on this output result.

The above-described test operation is repeatedly carried out at different test operating frequencies using the same test pattern, and delay faults are detected by determining whether the results are correct.

In Patent Documents 1-5, a technology is disclosed in which a new function is added to scan FFs to carry out efficient testing.

In Patent Document 1 and Patent Document 2, a technology is disclosed in which a scan FF is considered as two latches, and by further adding a latch, a plurality of values are held in the scan FFs. The activation of test paths in the delay test is thus facilitated.

In Patent Document 3 and Patent Document 4, a technology is disclosed in which an FF is newly added to a scan FF and a new value thus held. In this way, the direct supply of a particular FF value to the outside eliminates the need for scan-out, or the scan-out of the arithmetic results of the FF is realized by using a comparative function.

Patent Document 5 discloses a method that compresses test results by a logical circuit to identify a fault location.

Patent Document 1: JP-A-2007-187458
Patent Document 2: JP-A-2002-124852
Patent Document 3: JP-A-H05-060835
Patent Document 4: JP-A-H10-339762
Patent Document 5: JP-A-2004-361351

DISCLOSURE OF THE INVENTION

Problem to be Solved by the Invention

In the scan FFs described in Patent Documents 1-5, a scan-in operation is required for each test.

The scan operation, however, is no more than an auxiliary function for testing. The scan operation is therefore frequently not optimized in design, and a lengthy time interval is required for a single scan operation. As a result, only tests that use two or three types of frequency such as the frequency prescribed in the specifications and frequencies that allow for operating margins are typically carried out in delay testing. In contrast, raising the fault detection rate requires an increase of the types of test frequencies in the same pattern.

As a result, for high-quality testing, repeated scan operation is unavoidable. The problem therefore arises that the repetition of the scan operation results in an increase of the test time.

Specifically, the repeated rescanning in of the same test pattern for each test is one cause for the increase of test time. This point is further explained hereinbelow.

Even though the initial value is installed in a scan FF by scan-in according to the test pattern, the initial value in the scan FF is lost the instant a signal transition is brought about at a particular test operating frequency. As a result, each scan FF must be placed in the test mode and scan-in of the test pattern must again be carried out (the transfer in a shift register is used to set the initial value) to carry out a test at the next test frequency.

It is an object of the present invention to provide a semiconductor test apparatus, a semiconductor device, and a test method that can solve the above-described problem.

Means for Solving the Problem

The semiconductor test apparatus according to the present invention includes: a flip-flop that is provided with a first input terminal, a second input terminal, a mode terminal that accepts a mode signal that indicates either a first mode or a second mode, a clock terminal that accepts a clock signal, and an output terminal, that selects the first input terminal when the mode signal indicates the first mode, that selects the second input terminal when the mode signal indicates the second mode, and that holds information that is being received by the input terminal that was selected based on the mode signal in synchronization with the clock signal and supplies the information from the output terminal; and a hold unit that holds a set value and provides the set value to the first input terminal.

The semiconductor device according to the present invention includes: a test unit that has a plurality of the above-described semiconductor test apparatuses and in which the second input terminal of each semiconductor test apparatus is connected to the output terminal in the test-object logic circuit that corresponds to the second input terminal, and the output terminal of each semiconductor test apparatus is connected to the input terminal in the test-object logic circuit that corresponds to the output terminal; a storage unit that stores information for comparison; and a comparison-determination unit that compares information for comparison stored in the storage unit with the output from each output terminal in the test unit and supplies the result of comparison as output.

The test method according to the present invention is a test method that uses a test apparatus that has a plurality of semiconductor test apparatuses and in which the second input terminal of each semiconductor test apparatus is connected to the output terminal in the test-object logic circuit that corresponds to the second input terminal, and the output terminal of each semiconductor test apparatus is connected to the input terminal in the test-object logic circuit that corresponds to the output terminal; the test method repeatedly carrying out a series of operations of:
providing a clock signal to a clock terminal in a state in which a mode signal that indicates a first mode is supplied to the mode terminal in the plurality of semiconductor test apparatuses; and then, in a state in which a mode signal that indicates a second mode is provided to the mode terminal, providing a clock signal two times to a clock terminal and supplying test results from the output terminal.

Effect of the Invention

The present invention enables realization of a high-speed delay test.

EXPLANATION OF REFERENCE NUMBERS

| | |
|---|---|
| 100 | logic circuit |
| 1a-1c, 1Aa-1Ab, 1B, 1C | scan FF |
| 11 | main FF |
| 12 | hold unit, latch |
| 13, 83 | providing unit, MUX circuit |
| 2a-2b | signal-processing circuit |
| 2aA-2bA | path-switching circuit (MUX) |
| 3a-3b | correctness-judging circuit |
| 31 | hold unit, latch |
| 32 | comparison unit, XOR circuit |
| 4 | error-processing circuit |
| 5 | test unit |
| 6 | comparison-determination unit |
| 81, 81A | latch |
| 82 | AND circuit |
| 91, 94 | AND circuit |
| 92 | OR circuit |
| 93 | inverter |

BEST MODE FOR CARRYING OUT THE INVENTION

Explanation next regards exemplary embodiments of the present invention with reference to the accompanying figures.

First Exemplary Embodiment

Figure 1:
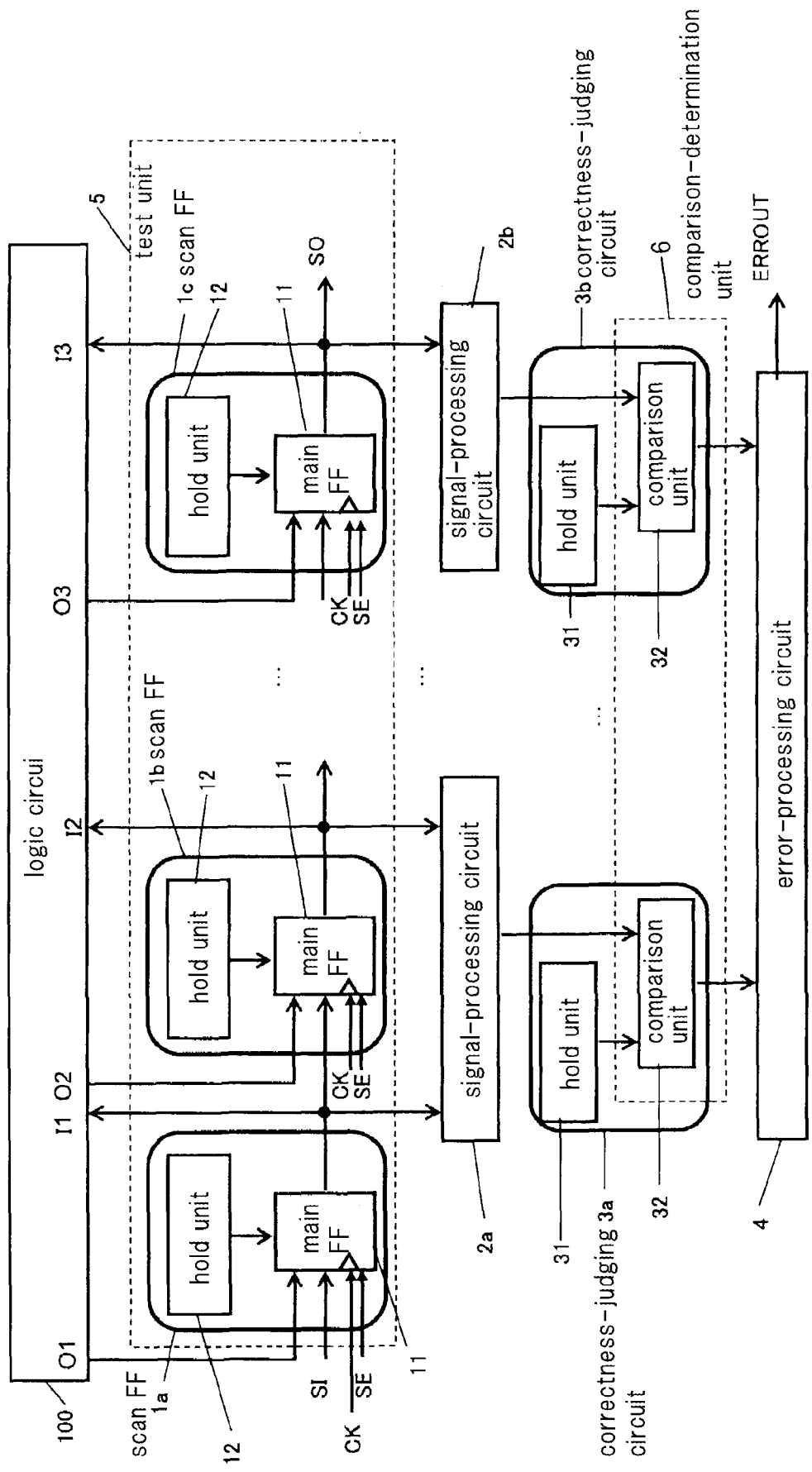
FIG. 1 is a block diagram showing the semiconductor device of the first exemplary embodiment of the present invention.

FIG. 1 is a block diagram showing the semiconductor device of the first exemplary embodiment of the present invention.

In FIG. 1, the semiconductor device includes: logic circuit 100 that is the object of testing, scan FFs 1a-1c, signal-processing circuits 2a-2b, correctness-judging circuits 3a-3b, and error-processing circuit 4.

Each of scan FFs 1a-1c includes main FF 11 and hold unit 12. Each of correctness-judging circuits 3a-3b includes hold unit 31 and comparison unit 32. Scan FFs 1a-1c are included in test unit 5. Each comparison unit 32 is included in comparison-determination unit 6.

Scan FFs 1a-1c can typically be called a semiconductor test apparatus.

Each of scan FFs 1a-1c is connected in series similar to an ordinary scan FF, supplies a signal to logic circuit 100, and in addition, acquires a signal from logic circuit 100. In the present exemplary embodiment, scan FFs 1a-1c are of the same configuration.

Figure 2:
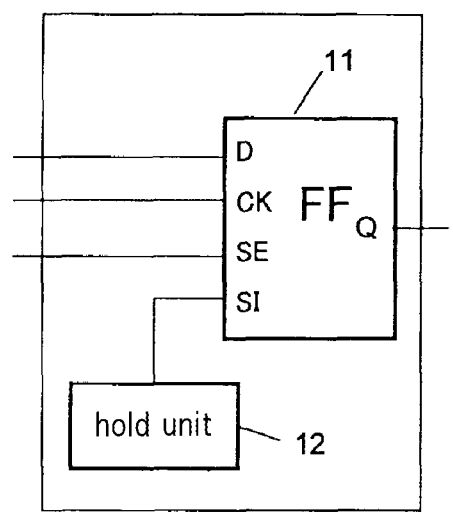
FIG. 2 is a block diagram showing a scan FF.

FIG. 2 is a block diagram showing scan FFs 1a-1c as scan FF 1.

Main FF 11 can typically be called a flip-flop.

Main FF 11 is provided with: data input terminal D, scan-in terminal SI, mode terminal SE that accepts a mode signal indicating either a test mode (first mode) or a normal mode (second mode), clock terminal CK that accepts a clock signal, and output terminal Q.

Scan-in terminal SI can typically be called the first input terminal. Data input terminal D can typically be called the second input terminal.

Main FF 11 selects either data input terminal D or scan-in terminal SI based on the mode signal. Main FF 11 synchronizes the information that is being received by the selected terminal with the clock signal, holds the information, and supplies the information from output terminal Q.

In the present exemplary embodiment, when the mode signal is the normal mode, main FF 11 selects data input terminal D, then synchronizes the information being received by data input terminal D with the clock signal, and then holds and supplies the information from output terminal Q.

When the mode signal indicates the test mode, main FF 11 selects scan-in terminal SI and then synchronizes the information being received by scan-in terminal SI with the clock signal, holds the information, and then supplies the information as output from output terminal Q.

Hold unit 12 can typically be called a hold means. Hold unit 12 holds a set value and supplies this set value to scan-in terminal SI. In the present exemplary embodiment, an initial value for testing is used as the set value.

In FIG. 2, scan-in terminal SI is used as the first input terminal, but as shown in FIG. 1, the first input terminal may be a terminal that differs from scan-in terminal SI.

In addition, in scan FF 1 shown in FIG. 2, hold unit 12 is directly connected to scan-in terminal SI, but scan FF 1 is not limited to this configuration. For example, scan-in terminal SI may also selectively receive the output from hold unit 12 and the output from scan FF 1 of the preceding stage.

Returning to FIG. 1, test unit 5 can also be typically called a test means.

In test unit 5, scan FFs 1a-1c are connected in a series. Data input terminal D of each scan FF 1 is connected to the output terminal in test-object logic circuit 100 that corresponds to itself (data input terminal D). Output terminal Q of each scan FF 1 is connected to an input terminal in test-object logic circuit 100 that corresponds to itself (output terminal Q).

In FIG. 1, data input terminal D of scan FF 1a is connected to output terminal O1 in test-object logic circuit 100. Output terminal Q of scan FF 1a is connected to input terminal I1 in test-object logic circuit 100.

Data input terminal D of scan FF 1b is connected to output terminal O2 in test-object logic circuit 100. Output terminal Q of scan FF 1b is connected to input terminal I2 in test-object logic cell 100.

In addition, data input terminal D of scan FF 1c is connected to output terminal O3 in test-object logic circuit 100. Output terminal Q of scan FF 1c is connected to input terminal I3 in test-object logic circuit 100.

As described hereinabove, the correlation between data input terminal D of test unit 5 and the output terminals in test-object logic circuit 100 and the correlation between output terminal Q in test unit 5 and the input terminals in test-object logic circuit 100 are determined in the design stage of the semiconductor device shown in FIG. 1.

Signal-processing circuit 2a decodes or compresses the output (hereinbelow referred to as "FF value") of the plurality of scan FFs 1 (scan FFs 1a and 1b in the present exemplary embodiment). Signal-processing circuit 2a provides the result of decoding or the result of compression to comparison unit 32 in correctness-judging circuit 3a.

Signal-processing circuit 2b decodes or compresses the output of scan FF 1. Signal-processing circuit 2b provides the result of decoding or the result of compression to comparison unit 32 in correctness-judging circuit 3b.

Correctness-judging circuits 3a-3b judge the correctness of the output (test results) of the plurality of scan FFs 1a-1c.

Hold unit 31 can also typically be called holding means. Hold unit 31 stores information for comparison.

Hold unit 31 in correctness-judging circuit 3a uses the expected operating value of the test-object logic circuit that corresponds to data input terminal D of scan FFs 1a-1b as the information for comparison.

Hold unit 31 in correctness-judging circuit 3b uses the expected operating value of the test-object logic circuit that corresponds to data input terminal D of scan FF 1c as the information for comparison.

Comparison-determination unit 6 can also typically be called comparison-determination means.

Comparison-determination unit 6 compares the information for comparison stored in hold unit 31 in correctness-judging circuit 3a or hold unit 31 in correctness-judging circuit 3b with the output from each output terminal Q in test unit 5 and supplies the result of this comparison.

Comparison unit 32 can also typically be referred to as comparison means.

Each of scan FFs 1a-1c corresponds to one of a plurality of comparison units 32. In the present exemplary embodiment, scan FFs 1a and 1b correspond to comparison unit 32 in correctness-judging circuit 3a, and scan FF 1c corresponds to comparison unit 32 in correctness-judging circuit 3b.

Comparison unit 32 in correctness-judging circuit 3a compares the output from output terminal Q of corresponding scan FFs 1a and 1b with the expected operating value in hold unit 31 that is included in correctness-judging circuit 3a and supplies the result of this comparison as output. In the present exemplary embodiment, comparison unit 32 in correctness-judging circuit 3a compares the output of signal-processing circuit 2a with the expected operating value in hold unit 31 contained in correctness-judging circuit 3a.

Comparison unit 32 in correctness-judging circuit 3b compares the output from output terminal Q of corresponding scan FF 1c with the expected operating value in hold unit 31 that is contained in correctness-judging circuit 3b and supplies the result of this comparison as output. In the present exemplary embodiment, comparison unit 32 in correctness-judging circuit 3b compares the output of signal-processing circuit 2b with the expected operating value in hold unit 31 contained in correctness-judging circuit 3b.

Error-processing circuit 4 can typically be called determination means.

Error-processing circuit 4 determines errors based on the results of comparison (results of diagnosing correctness) from each of the plurality of comparison units 32.

In the state in which the mode signal indicates the test mode, each main FF 11 of the present exemplary embodiment holds and supplies as output the set value provided from hold unit 12 at a timing (any timing) that corresponds to the clock signal. As a result, the set value can be set in main FF 11 at any time by appropriately setting the input timing of the mode signal and clock signal.

In this way, the output state of each scan FF 1 can be returned at high speed to the state before testing without implementing scan-in that sets the set value to each scan FF 1 using the transfer in the shift register made up by the plurality of scan FFs 1.

In the present exemplary embodiment, an initial value for testing is used as the set value. In this case, the output state of each scan FF 1 can be returned at high speed to the initial value for testing.

In the present exemplary embodiment, data input terminal D of each scan FF 1 is connected to an output terminal in test-object logic circuit 100 that corresponds to itself (data input terminal D). In addition, output terminal Q of each scan FF 1 is connected to an input terminal in test-object logic circuit 100 that corresponds to itself (output terminal). Further, hold unit 31 holds information for comparison. Still further, comparison unit 32 compares test result (output of scan FF 1) with the information for comparison and supplies the results of this comparison as output.

In this way, a test result can be compared with information for comparison at a fine granularity on the order of several FFs.

The above-described effects are produced when carrying out a delay fault test of logic circuit 100 using, for example, a configuration in which the signal-processing circuits and error-processing circuits are omitted from the semiconductor device shown in FIG. 1, and more specifically, using a semiconductor device composed of test unit 5, hold unit 31, and comparison-determination unit 6.

In the present exemplary embodiment, an expected operating value is used as the information for comparison. In this case, a test result can be compared with the expected operating value, whereby determining whether the test results are correct can be carried out.

In the present exemplary embodiment, comparison-determination unit 6 includes a plurality of comparison units 32. Comparison units 32 compare output from output terminals Q in corresponding scan FFs 1 with the information for comparison and supply the results of this comparison as output. Error-processing circuit 4 determines errors based not on test results but on the results of comparison from each of the plurality of comparison units 32.

In the related art, in comparison to the processing by an error-processing circuit of test results that are complex bit sequences of "0" and "1," error-processing circuit 4 in the present exemplary embodiment may process a signal of a form in which, for example, "0" indicates a fault and "1" indicates normal (correctness determination results). As a result, errors are easily compiled and high-speed and high-quality fault detection can be realized.

Thus, by including value-holding functions and processing circuits that correspond to each of the processes of scan-in and scan-out, the two operations of scan-in and scan-out can be simultaneously eliminated and high-speed delay testing can be realized.

In the present exemplary embodiment, the number of scan FFs, the number of signal-processing circuits, the number of correctness-judging circuits, the number of hold units 31, and the number of comparison units 32 are not limited to the above description and can be altered as appropriate.

Second Exemplary Embodiment

Figure 3:
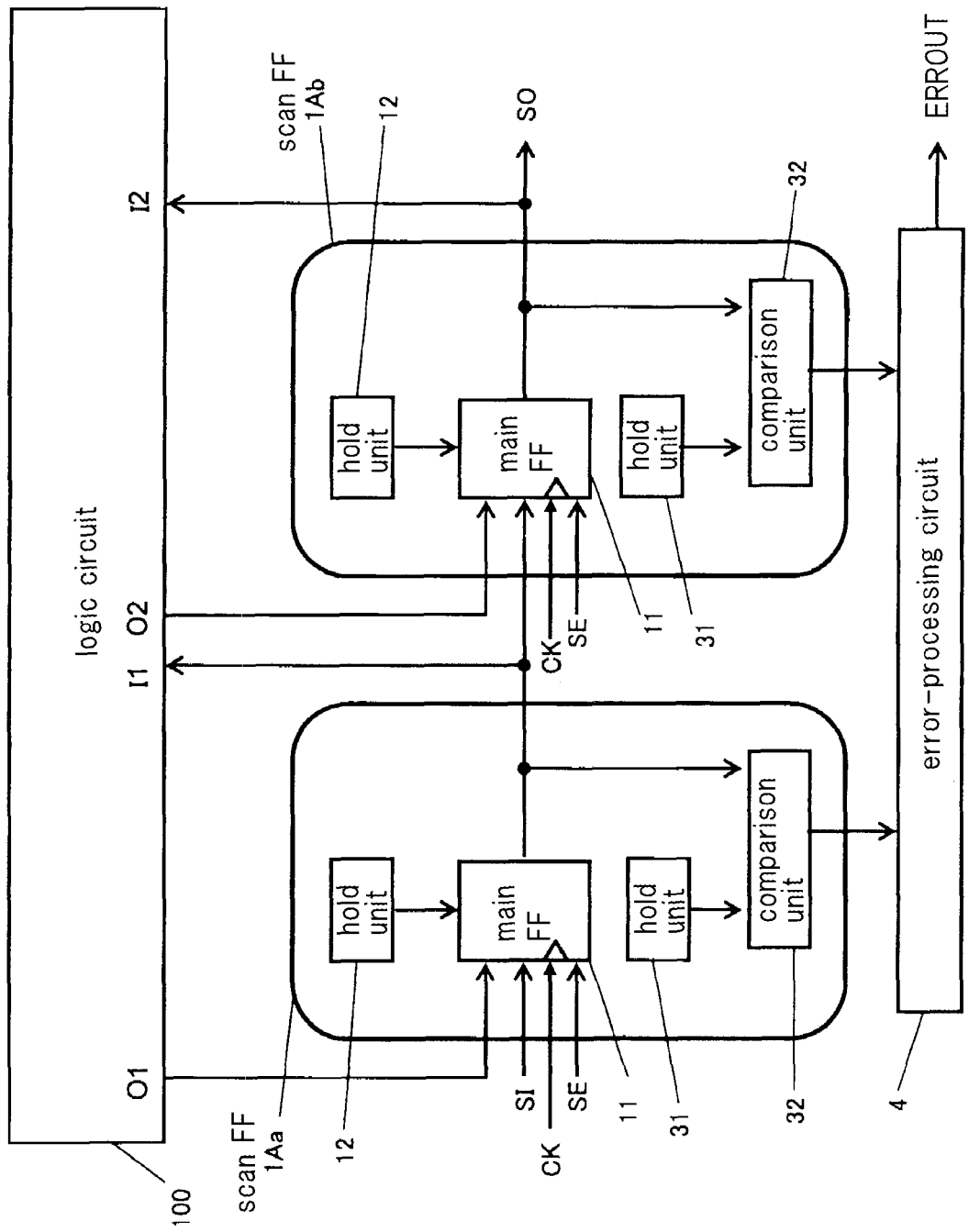
FIG. 3 is a block diagram showing the second exemplary embodiment of the present invention.

FIG. 3 is a block diagram showing the second exemplary embodiment of the present invention. In FIG. 3, elements of the same configuration as shown in FIG. 1 are given the same reference numbers.

In the second exemplary embodiment, the correctness-judging circuits (hold unit 31 and comparison unit 32) correspond one-to-one with scan FFs. In addition, the correctness-judging circuits are contained in the corresponding scan FFs.

Typically, scan FFs are incorporated in a circuit by replacing FFs contained in the circuit with scan FFs after completion of the design of the test-object logic cell. In the present exemplary embodiment, other than the scan FFs, only error-processing circuits have test functions. As a result, scan paths can be built in at substantially the same flow (man-hours) as the designed flow by merely replacing the scan FFs of the related art with scan FFs of the present exemplary embodiment.

In addition, in the scan FF of the present exemplary embodiment, delay may be set in the scan FF, thus eliminating the need for an optimization process in the design of the overall delay and allowing mitigation of limits on the overall design.

In this way, the design period can be shortened and higher speeds of the overall circuit can be achieved.

In addition, due to the need for a huge number of scan FFs in a large-scale circuit, scan FFs are normally prepared as a single module. Similarly, preparing the scan FFs in the present exemplary embodiment as a single module optimized at the transistor level can achieve smaller area of the overall circuit and higher performance.

The semiconductor device of the present exemplary embodiment includes logic circuit 100, scan FFs 1Aa-1Ab, and error-processing circuit 4. In the present exemplary embodiment, the number of scan FFs 1A is not limited to the above-described form and can be altered as appropriate.

Scan FFs 1Aa-1Ab are connected in series as in normal scan FFs, supply a signal to logic circuit 100, and further, acquire a signal from logic circuit 100.

Each scan FF 1A includes main FF 11, hold unit 12, hold unit 31, and comparison unit 32.

In the present exemplary embodiment, each main FF 11 holds and supplies the set value supplied from hold unit 12 at a timing that accords with the clock signal in the state in which the mode signal indicates the test mode. As a result, the initial value for testing can be set to main FF 11 at any timing.

In this way, an initial value for testing that makes up a test pattern can be set to each scan FF 1A without carrying out scan-in.

In the present exemplary embodiment, hold unit 31 holds the expected operating value. Comparison unit 32 compares the test result (the output of scan FF 1A) with the expected operating value and supplies the result of this comparison. As a result, each scan FF 1A can judge whether the results are correct without scan-out.

In the present exemplary embodiment, comparison unit 32 is designed such that only comparison unit 32 of scan FF 1A in which an error has occurred supplies "1" as output. In this way, correctness diagnosis results can be obtained that can be comprehended intuitively. Results that can be understood intuitively enable efficient screening in inspections such as screening for defective products because steps of comparing inspection results with results that are correct are unnecessary.

The above-described "main FF" indicates a latch or FF having the functions of being able to hold a single value, supplying the value being held to a logic circuit, and acquiring a value from the logic circuit. An FF is viewed as a plurality of latches, and in a configuration that holds a plurality of values, "main FF" indicates a latch that supplies a signal to a logic circuit.

Explanation next regards an example of the configuration and operation of scan FF 1A.

Figure 4:
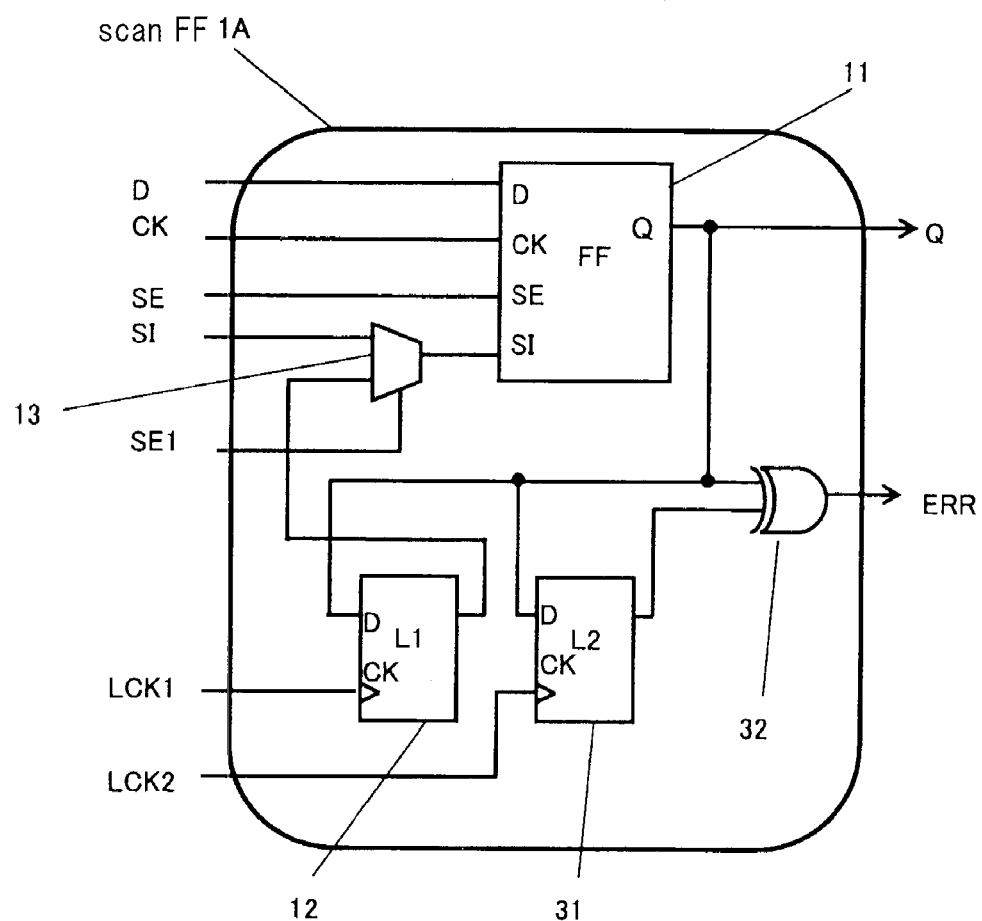
FIG. 4 is a circuit diagram of an exemplary embodiment of scan FF 1A.

FIG. 4 is a circuit diagram of an exemplary embodiment of scan FF 1A.

Scan FF 1A includes: main FF 11, latch 12, multiplexer circuit (hereinbelow abbreviated as "MUX circuit") 13, latch 31, and exclusive OR circuit (hereinbelow abbreviated as "XOR circuit") 32.

Latch 12 is one example of hold unit 12, and can typically be called a hold unit or holding means. MUX circuit 13 can typically be called a providing unit or providing means. Latch 31 is one example of hold unit 31 and can typically be called a hold unit or storage means. XOR circuit 32 is one example of comparison unit 32 and can typically be called a comparison unit or comparison means.

Main FF 11 uses a D signal supplied from test-object logic circuit 100, clock (CK) signal, a mode switching (SE) signal (mode signal), a scan-in data (SI) signal, and a signal (initial value for testing) from latch 12 as input signals, and supplies the value that it (main FF 11) holds as output.

The D signal is provided to data input terminal D. The clock (CK) signal is provided to clock terminal CK. The mode-switching (SE) signal is provided to mode terminal SE. The scan-in data (SI) signal is provided to scan-in terminal SI by way of MUX circuit 13. The signal from latch 12 (initial value for testing) is provided to scan-in terminal SI by way of MUX circuit 13.

The output of main FF 11 is applied as input to data input D terminal of each of latches 12 and 31. The output of main FF 11 is held in latches 12 and 13 at the timing of latch clocks LCK1 and LCK2, respectively.

XOR circuit 32 compares the held value of latch 31 (=expected operating value) with the output of main FF 11 and supplies the comparison result as an ERR signal.

In the present exemplary embodiment, XOR circuit 32 supplies "0" as the ERR signal if the output of main FF 11 and the held value of latch 31 are equal and supplies "1" as the ERR signal if the two values differ.

MUX circuit 13 accepts the output signal of latch 12, the scan-in data (SI) signal, and the function-switching (SE1) signal. MUX circuit 13 provides scan-in data (SI) signal to the scan-in terminal SI of main FF 11 when the function-switching (SE1) signal is "0," and supplies the output signal of latch 12 to scan-in terminal SI of main FF 11 when the function-switching (SE1) signal is "1."

Main FF 11 latches the D signal at a timing synchronized with the clock (CK) signal if the mode-switching (SE) signal is "0." Main FF 11 latches the scan-in data (SI) signal at a timing synchronized with the clock (CL) signal if the mode-switching (SE) signal is "1," and moreover, the function-switching (SE1) signal is "0." Main FF 11 latches the value held by latch 12 at a timing synchronized with the clock (CK) signal if the mode-switching (SE) signal is "1," and moreover, if the function-switching (SE1) signal is "1."

In other words, the initial value (the value of latch 12) is immediately set in main FF 11 when the clock (CK) signal is applied as input to main FF 11 in the state in which mode-switching (SE) signal is "1," and moreover, when function-switching (SE1) signal is "1." As a result, the output of main FF 11 can be returned to the state before testing at high speed.

On the other hand, in normal mode, when main FF 11 latches the test result (the output from logic circuit 100), XOR circuit 32 compares the test result with the expected value (the value of latch 31). As a result, correctness diagnosis results can be immediately obtained for each main FF 11.

This circuit uses standard cells and therefore facilitates design by design tools. In addition, this circuit can minimize additions to signals having an influence on the performance of a test-object circuit such as the clock (CK) signal and D signal. Of course, circuits having similar functions in which these circuits are adjusted at the transistor level or layout level can be easily imagined as another exemplary embodiment.

Figure 5:
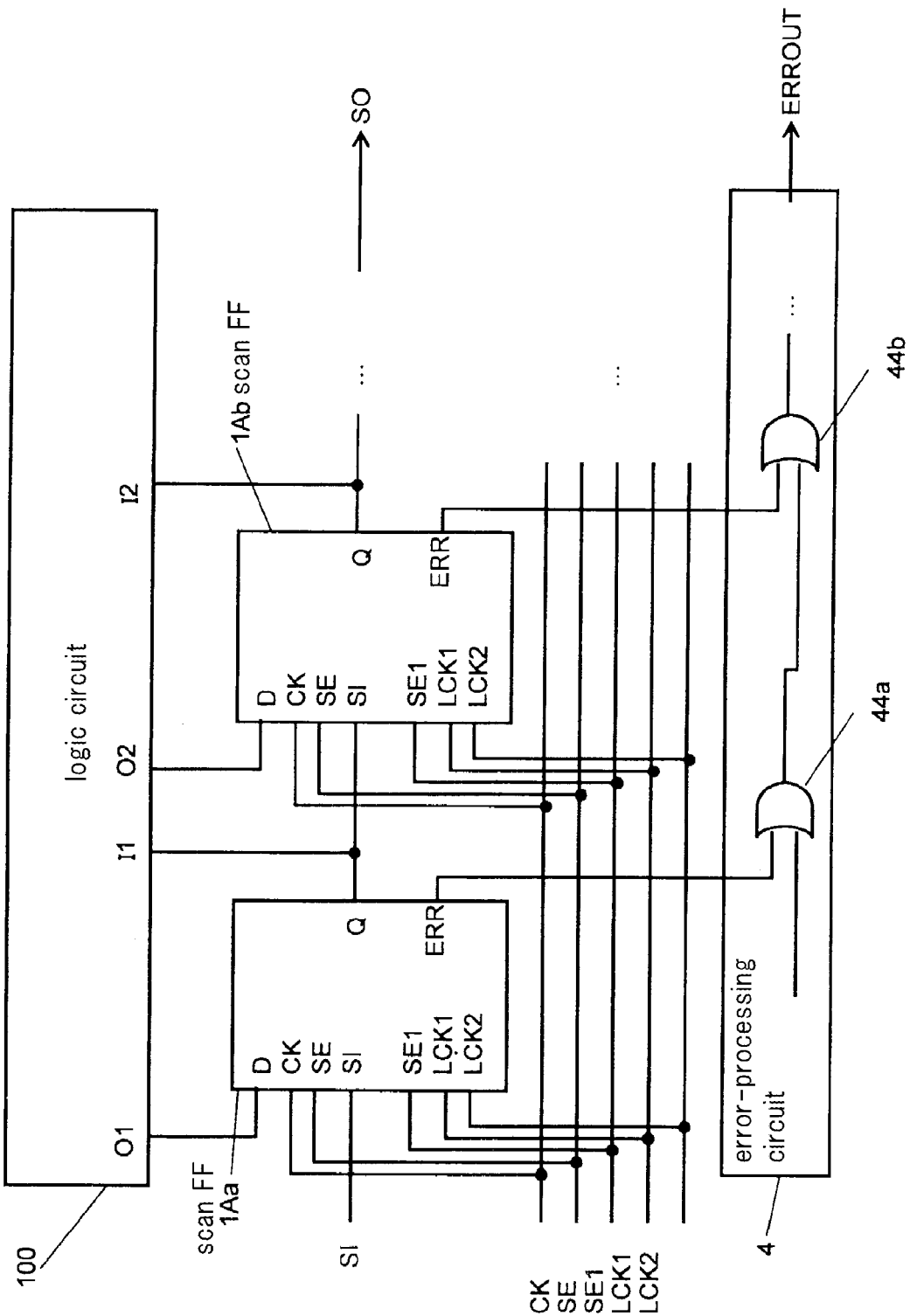
FIG. 5 is an explanatory view showing the overall configuration of a semiconductor device.

FIG. 5 is an explanatory view showing the overall configuration of a semiconductor device that uses scan FFs 1A shown in FIG. 4.

In FIG. 5, scan FFs 1A are connected in series, and the comparison result of each scan FF 1A is applied as input to error-processing circuit 4.

In error-processing circuit 4, OR circuits 44a-44b take the OR of the correctness result (ERR) from each scan FF 1A and supply the result as the final error output ERROUT. In the present exemplary embodiment, the correctness result (ERR) of scan FF 1A is "1" when an error is indicated. On the other hand, the correctness result (ERR) of scan FF 1A is "0" when no error is indicated. As a result, errors can be accurately supplied as output even when errors occur in a plurality of scan FFs 11.

In the present exemplary embodiment, a configuration is used as an error-processing circuit that takes the OR of one signal at a time in order, but a configuration that organizes the correctness results (ERR) for every two signals in tree form or an error-processing circuit realized by algorithm of the related art may also be used.

Although function-switching (SE1) signal and latch clocks LCK1 and LCK2 have been added in the present exemplary embodiment, neither signal has timing restrictions. As a result, the design can be facilitated using a design tool.

Figure 6:
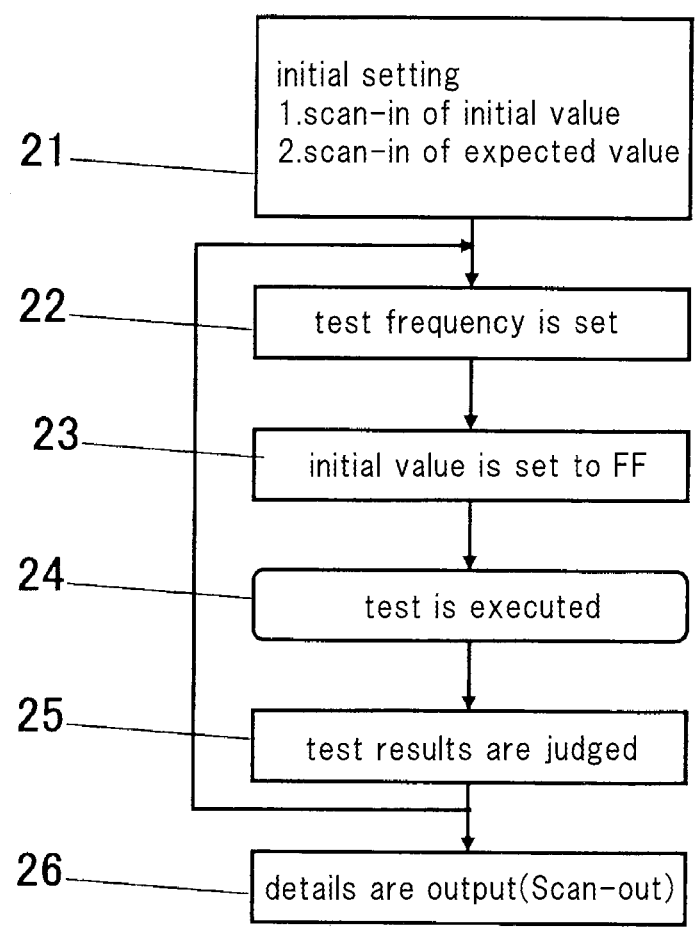
FIG. 6 is a flow chart for explaining the operations of the present exemplary embodiment.

FIG. 6 is a flow chart for explaining the operations of the present exemplary embodiment.

In the present exemplary embodiment, each scan FF 1A holds two values (initial value and expected value). As a result, a scan-in operation that sets the initial value in each latch 12 and a scan-in operation that sets the expected value in each latch 31 are first carried out as the initial setting of a test (Step 21).

More specifically, the mode-switching (SE) signal is first made "1" and each scan FF 1A is set to the test mode. In this state, the function-switching (SE1) signal is made "0" and a test pattern composed of the initial values set in each latch 12 is synchronized to the clock (CL) signal and supplied to scan-in terminal SI of scan FF 1A of the foremost stage. Latch clock LCK1 is then supplied at a predetermined timing and the expected value is set in each latch 12.

A pattern composed of the expected values that are set in each latch 13 is synchronized to the clock (CK) signal and supplied to scan-in terminal SI of the foremost-stage scan FF 1A. Latch clock LCK2 is then supplied at a predetermined timing and the expected value is then set in each latch 31.

When scan-in for initial settings (Step 21) has been completed, the test frequency is set (Step 22).

When the test frequency has been determined, the mode-switching (SE) signal is made "1" and the function-switching (SE1) signal is made "1." In this state, the initial value (the value of latch 12) is set to main FF 11 by applying the clock (CK) signal as input to main FF 11 (Step 23).

Testing is then executed (Step 24). More specifically, the mode-switching (SE) signal is set to "0" and two clock (CK) signals are applied as input at the test frequency that was set.

By executing testing, the test results are compared with the expected values the instant the test results are latched in main FF 11 of each scan FF 1A and the correctness judgment results are immediately supplied as output (Step 25).

If the correctness judgment results of operations are obtained, the test frequency is changed to the next test frequency (Step 22), the initial values are again set to main FF 11 (Step 23), and the test is then executed (Step 24).

Repeating these operations enables a test to determine the operating frequency at which a delay fault occurs.

In order to obtain detailed test results according to the situation, scan-out of the test results is also possible (Step 26). For example, in order to enable identification of an error site at the time the error signal becomes "1," scan-out of the test results is also possible.

Figure 7:
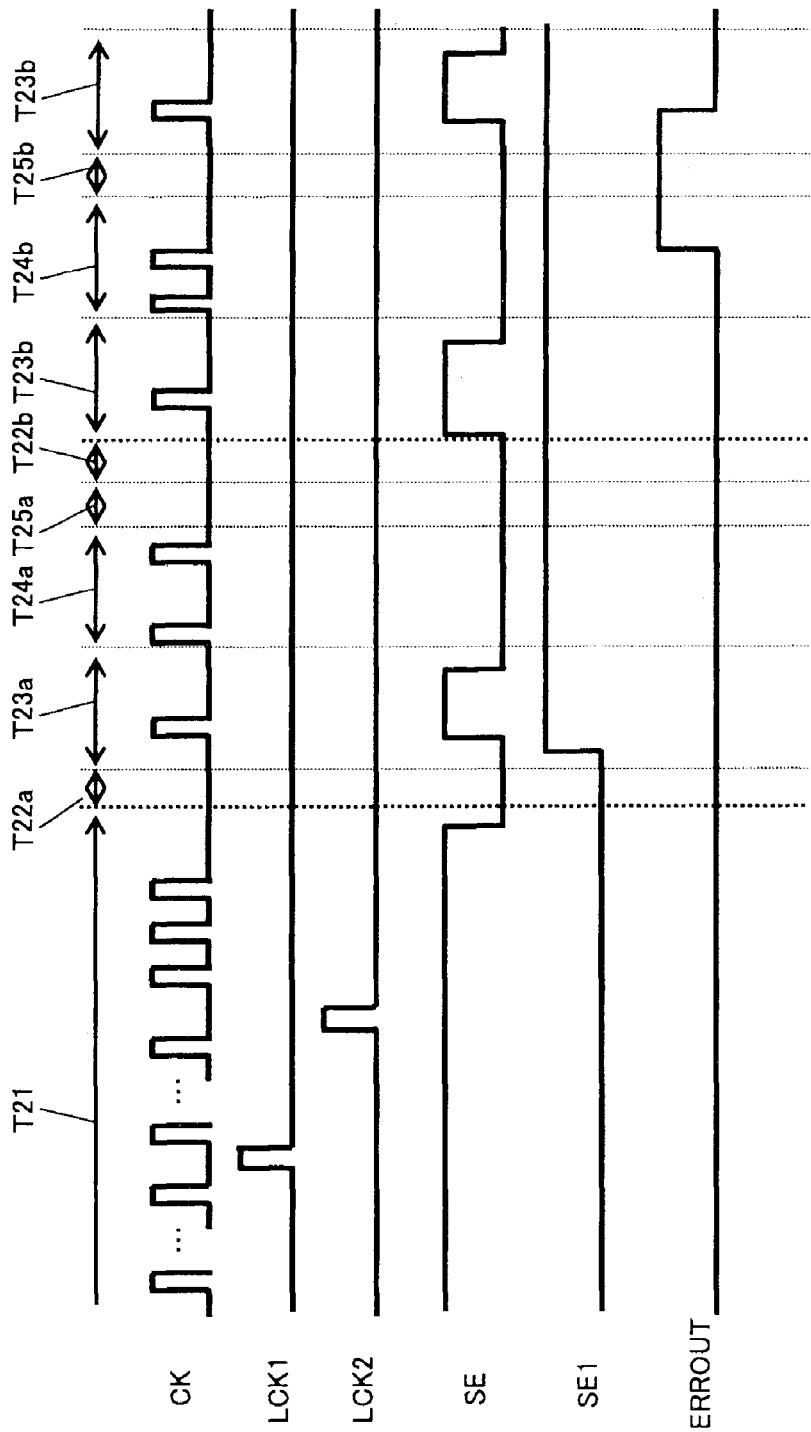
FIG. 7 is a timing chart for explaining operations.

FIG. 7 is a timing chart for explaining the actual operations of the circuit described in FIGS. 4 and 5. The circuit operations follow the flow chart described in FIG. 6.

First, the mode-switching (SE) signal is set to "1" and moreover, the function-switching (SE1) signal is set to "0" for the initial settings, and scan-in is executed. In other words, clocks LCK1 and LCK2 are applied as input and the value of main FF 11 is taken in by latches 12 and 31 at the timings of input such that latches 12 and 31 acquire the initial value and expected value (T21).

The test frequency is then set (T22a). Next, the mode-switching (SE) signal is set to "1" and moreover, the function-switching (SE1) signal is set to "1." As a result, the initial value being held in latch 12 is set in main FF 11 with the input of clock (CK) signal (T23a).

The actual test operation is then executed (T24a). Next, after the correctness diagnosis result ERROUT of the test has been checked (T25a), the test frequency is set to a new value (T22b). The test is then executed (Steps T23b and T24b). In the test of T24b, the test frequency is high, and an error is detected in T25b.

By repeating these operations, a high-speed delay test can be realized.

In the present exemplary embodiment, each of the plurality of comparison units 32 has a one-to-one correspondence with each of the plurality of scan FFs 1A.

In this case, determining whether the test results are correct can be carried out for each scan FF 1A.

Third Exemplary Embodiment

Figure 8:
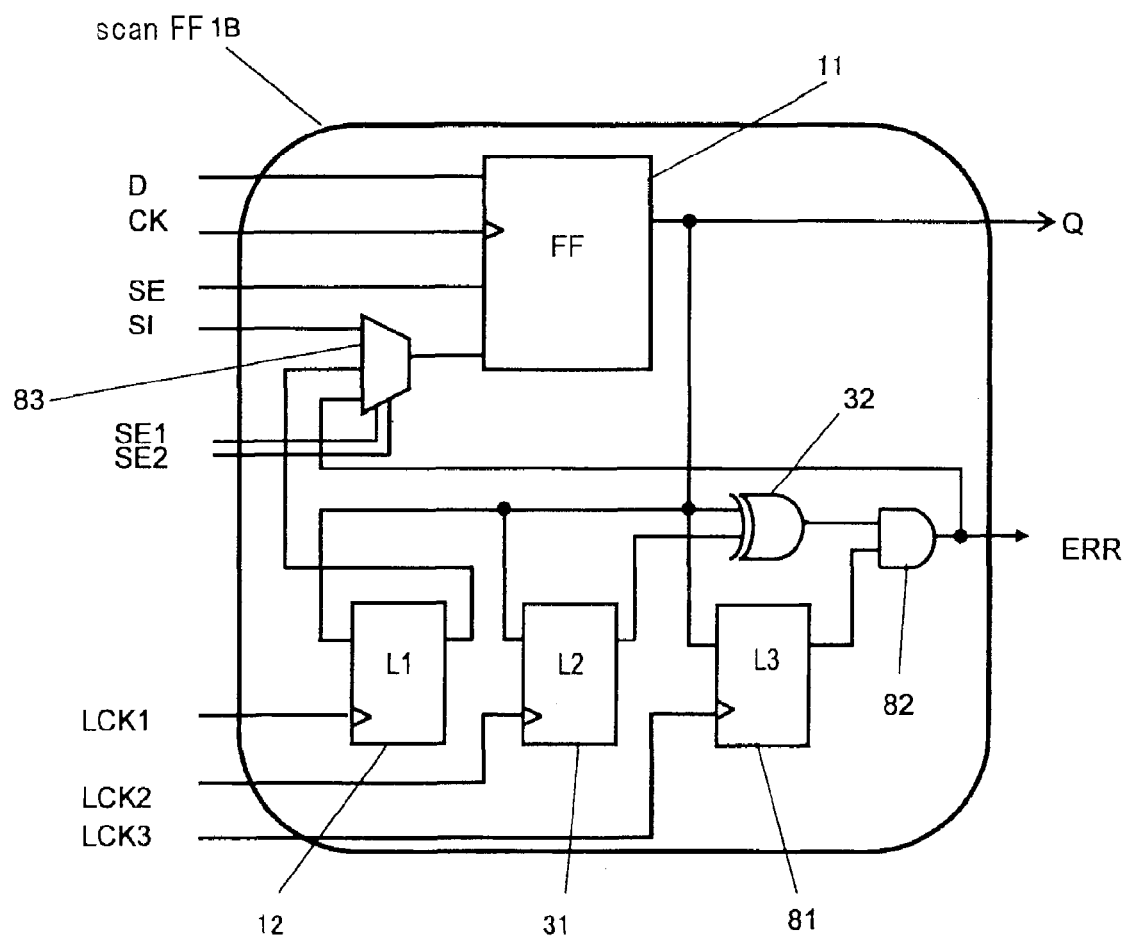
FIG. 8 is a block diagram showing the third exemplary embodiment of the present invention.

FIG. 8 is a block diagram showing the third exemplary embodiment of the present invention. FIG. 8 corresponds to FIG. 4 of the second exemplary embodiment. In FIG. 8, constituent elements that are identical to elements shown in FIG. 4 are given the same reference numbers.

In the third exemplary embodiment, scan FFs are used in which new functions have been added to the scan FFs of the second exemplary embodiment. More specifically, in the third exemplary embodiment, latch 81 and AND circuit 82 have been added to the configuration of the second exemplary embodiment, and MUX circuit 83 is provided in place of MUX circuit 13, whereby the connection relations of the signals are altered.

Latch 81 can typically be called a storage means. Latch 81 stores information for output control.

The output of main FF 11 is applied as D signal to latch 81 as with latches 12 and 31, and LCK 3 is applied as the latch clock. The value held by latch 81 is supplied as output to AND circuit 82.

AND circuit 82 can typically be called a control means.

Based on the information for output control in latch 81, AND circuit 82 is switched between a state in which comparison results from XOR circuit 32 are supplied as output and a state in which a predetermined value is supplied as output.

In the present exemplary embodiment, AND circuit 82 carries out an AND operation of the result of comparison from XOR circuit 32 and the value of latch 81 and supplies this result as the ERR signal. AND circuit 82 further supplies the ERR signal to MUX circuit 83.

MUX circuit 83 can typically be called a providing unit or providing means.

A scan-in (SI) signal from scan FF 1B of the preceding section (a scan-in (SI) signal from the outside when MUX circuit 83 is in scan FF 1B of the foremost section), the output of AND circuit 82, and the held value of latch 12 are applied as input to MUX circuit 83. In MUX circuit 83, the input signal that is supplied as output is controlled by function-switching signals SE1 and SE2.

If function-switching signal SE1 is "0," and moreover, if function-switching signal SE2 is "0," MUX circuit 83 supplies the scan-in (SI) signal. If function-switching signal SE1 is "1," and moreover, if function-switching signal SE2 is "0," MUX circuit 83 supplies the held value of latch 12 as output. If function-switching signal SE1 is "1," and moreover, function-switching signal SE2 is "1," MUX circuit 83 supplies the output of AND circuit 82 (correctness diagnosis result) as output.

If the mode-switching (SE) signal is "0," main FF 11 latches the D signal at a timing based on the clock (CK) signal. If the mode-switching (SE) signal is "1," and moreover, if function-switching signal SE1 is "0" and if function-switching signal SE2 is "0," main FF 11 latches scan-in (SI) signal at a timing based on the clock (CK) signal. If the mode-switching (SE) signal is "1," and moreover, if function-switching signal SE1 is "1" and if function-switching signal SE2 is "0," main FF 11 latches the held value of latch 12 at a timing based on the clock (CK) signal. If the mode-switching (SE) signal is "1," and moreover, if function-switching signal SE1 is "1" and if function-switching signal SE2 is "1," main FF 11 latches the output of AND circuit 82 (correctness diagnosis results) at a timing based on the clock (CK) signal.

The first function that has been added in the present exemplary embodiment is a masking function of the comparison operation.

For example, a path for reading a value from a memory or register exists in a circuit. In a read process, the value that is read differs depending on the state of a memory or register. As a result, in a test, logic circuit 100 cannot necessarily compute all expected values (correct test results).

In a test that includes such indefinite values (values in an indefinite state), a correctness judgment cannot be carried out accurately by only comparison by XOR circuit 32.

In the present exemplary embodiment, latch 81 sets output control information (output control information that indicates whether the output of main FF 11 is in an indefinite state) that indicates whether main FF 11 is included in a path that supplies an indefinite value (indefinite value path). For example, output control information that is "0" indicates that the output of main FF 11 is in an indefinite state. On the other hand, output control information that is "1" indicates that the output of main FF 11 is not in an indefinite state, i.e., that an expected value exists.

AND circuit 82 takes the AND of the comparison result (output of XOR circuit 32) and the output control information to fix the correctness judgment result to "0" when main FF 11 is included on an indefinite path.

In this way, a mask function of the comparison operation result can be realized and accurate correctness judgment can be achieved even when an indefinite path is present in a circuit.

The second function that has been added to the present exemplary embodiment is a function in which MUX circuit 83 sets correctness judgment results to main FF 11.

In this way, the correctness judgment result is set to main FF 11 at the same time that the correctness judgment result is supplied to error-processing circuit 4. As a result, results when the correctness judgment results have been scanned out can be supplied in a form that facilitates intuitive comprehension.

More specifically, the correctness result of error-processing circuit 4 is supplied with "1" as a fault and "0" as normal, but in the present exemplary embodiment, a scan-out result can also be supplied with "1" as a fault and "0" as normal.

In this way, the site of a fault can be immediately comprehended.

This function is effective for, for example, perceiving information about distribution of faulty paths and can provide information that is effective for fault analysis.

Fourth Exemplary Embodiment

Figure 9:
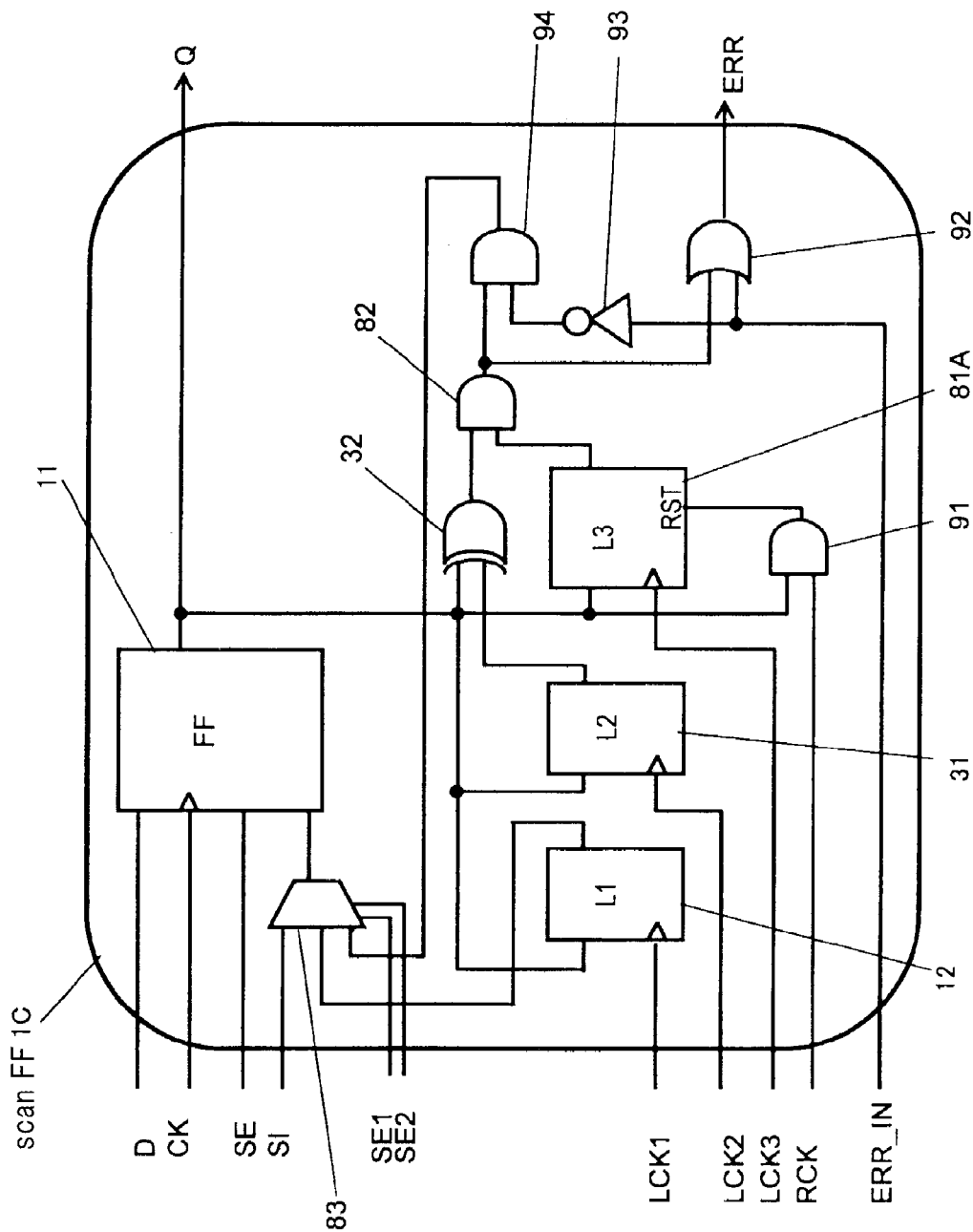
FIG. 9 is a block diagram showing the fourth exemplary embodiment of the present invention.
Figure 10:
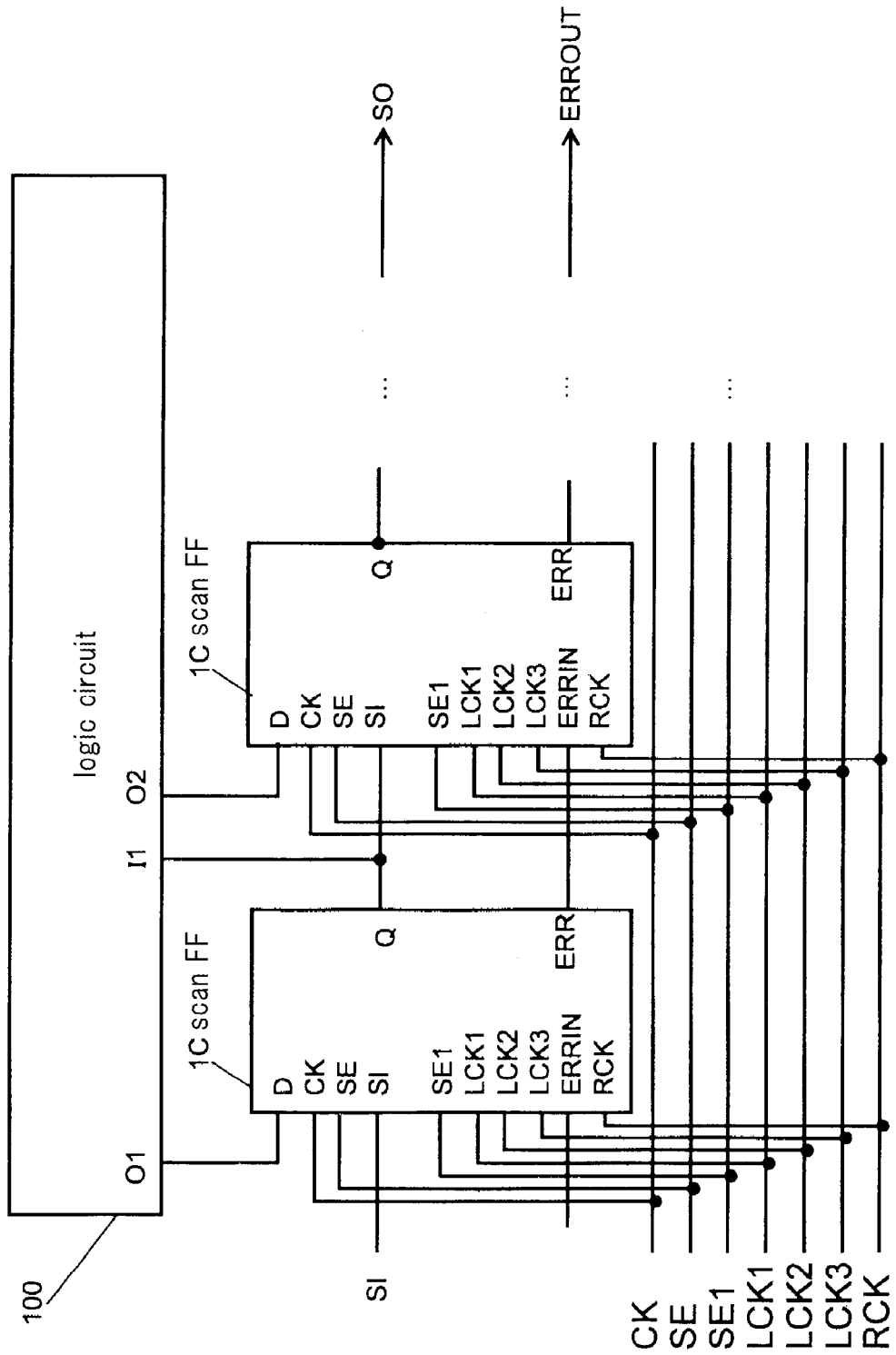
FIG. 10 is a block diagram showing the overall configuration of a semiconductor device.

FIG. 9 is a block diagram showing the fourth exemplary embodiment of the present invention. FIG. 9 corresponds to FIG. 8 of the third exemplary embodiment. In FIG. 9, constituent elements identical to elements shown in FIG. 8 are given the same reference numbers. FIG. 10 is a block diagram showing the overall configuration of a semiconductor device.

In the fourth exemplary embodiment, scan FFs are used in which new functions are further added to the scan FF of the third exemplary embodiment. More specifically, a portion of the error-processing circuit is included in scan FF 1C. Still further, in the fourth exemplary embodiment, AND circuits 91 and 94, OR circuit 92, and inverter 93 are added to the configuration of the third exemplary embodiment, and latch 81A is provided in place of latch 81. In this way, signal connection relations have been altered.

Latch 81A can typically be called a storage means. Latch 81A is of a configuration in which a reset terminal is provided to latch 81.

AND circuit 91 can typically be called an updating means.

AND circuit 91 updates the information for output control in latch 81A based on the result of comparison from XOR circuit 32. More specifically, AND circuit 91 uses the value of main FF 11 that indicates the result of comparison from XOR circuit 32 and RCK signal for latch reset as input and supplies a signal for reset to latch 81A.

AND circuit 94 uses an inverted signal of ERR_IN that is the correctness judgment result of the preceding section and the correctness judgment result of scan FF 1C as input and supplies the AND of these values to MUX circuit 83.

OR circuit 92 uses ERR_IN and the correctness judgment result as input and supplies the OR result as ERR.

The first function that has been added in the present exemplary embodiment is a totalizing function of the correctness judgment results (ERR).

This function is executed by an error-processing circuit in the second exemplary embodiment. In the present exemplary embodiment, this function is provided in each scan FF 1C, whereby the design of error-processing circuits as separate blocks is eliminated and a simplification of the design can be realized.

Totalizing the correctness diagnosis results in scan FF 1C allows reflection upon the signal processing in scan FF 1C, and a more accurate correctness diagnosis can therefore be achieved.

The second function that has been added in the present exemplary embodiment is the function of updating the value of latch 81A.

In a delay fault test in which the test is repeated using the same pattern but while raising the test frequency, scan FF 1C that once supplies an error continues to supply errors in succeeding tests.

As a result, when the correctness judgment results is "1," the diagnosis result of each frequency must be held outside the chip to confirm the frequency at which the error first occurred.

In the present exemplary embodiment, however, RCK is applied as input to AND circuit 91 after the correctness diagnosis results are set in main FF 11. As a result, a configuration is realized in which the value of latch 81A can be set to "0" according to the correctness judgment results.

In this way, when the correctness judgment result is "1" (an error has been supplied), the value of latch 81A becomes "0." As a result, an error can be supplied as output only at the test frequency at which the error first occurred.

The third function that has been added in the present exemplary embodiment is a function for limiting the number of simultaneous executions of the function of updating the value of latch 81A to one execution.

In the above-described first to fourth exemplary embodiments, an error signal process that uses OR was carried out even when errors occur at a plurality of main FFs 11 at the same test frequency, thereby complicating an easy grasp of the number of errors.

In the present exemplary embodiment, AND circuit 94 has a configuration that carries out a process that processes the correctness judgment result in each main FF 11 and the OR ERR_IN signals of the correctness judgment of preceding main FFs 11 by AND process and enables setting this value to main FF 11.

ERR_IN indicates "1" if there exists main FF 11 that has detected an error among main FFs 11 up to the preceding section, and indicates "0" if such main FF 11 does not exist. Thus, updating the value of latch 81A only when ERR_IN is "0" can limit to one the number of latches 81A in which a value is simultaneously updated.

By carrying out the test repeatedly until the ERROUT signal is "0" at each test frequency, the number of errors at that test frequency can be acquired by using the index of the number of repetitions.

Fifth Exemplary Embodiment

Figure 11:
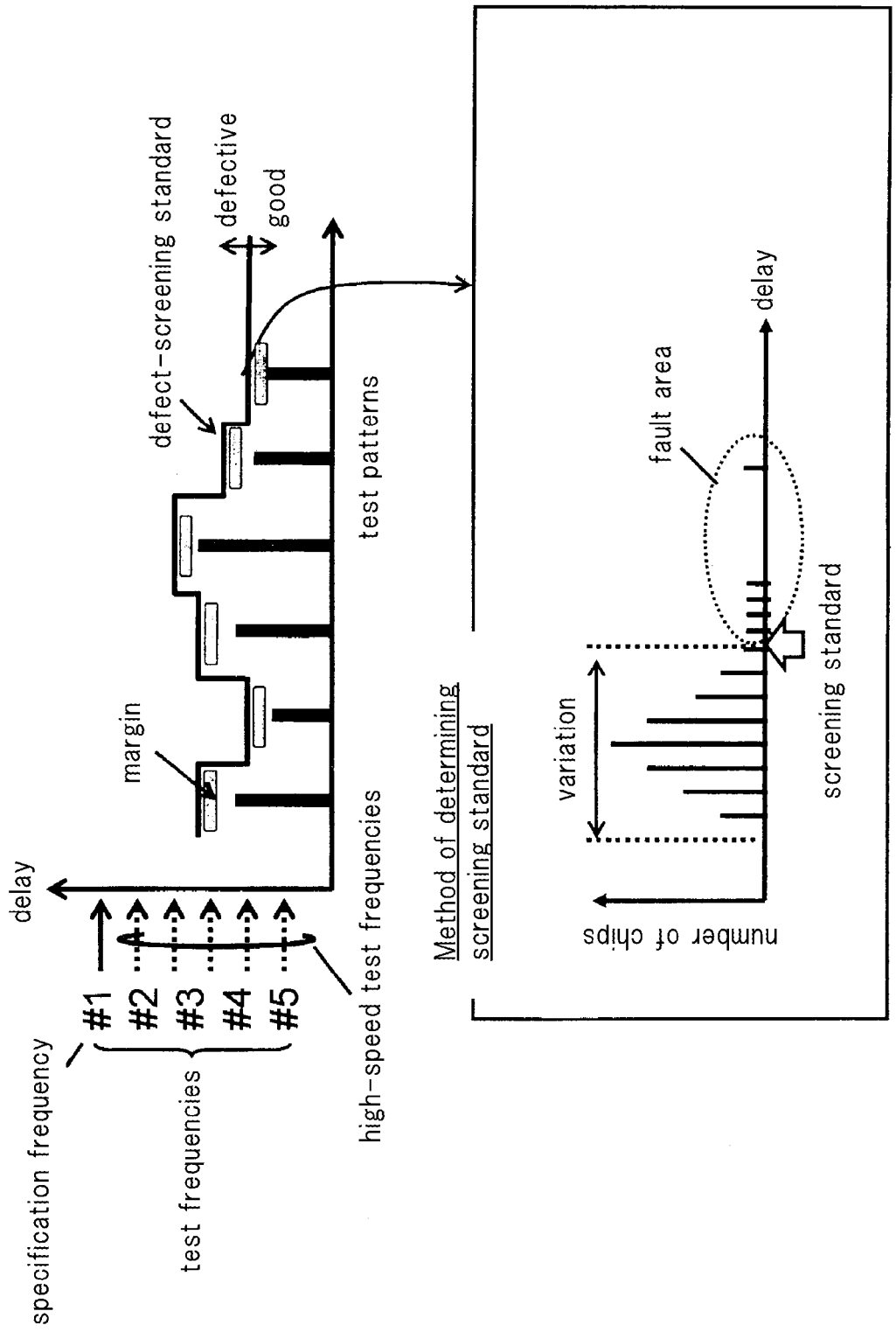
FIG. 11 is an explanatory view for explaining the fifth exemplary embodiment of the present invention.

FIG. 11 shows the fifth exemplary embodiment of the present invention. The fifth exemplary embodiment relates to a test method that uses the above-described semiconductor device.

The test is carried out using a plurality of test patterns. In a test of the related art, determination of defective chips was carried out by implementing tests at a fixed frequency regardless of the test pattern.

However, because the actual amount of delay varies according to the test pattern, testing at a fixed frequency gives rise to a large margin, and the precision of a screening test therefore cannot be raised.

In the present exemplary embodiment, setting the screening standard for each pattern enables an improvement of the margin of the actual delay and screening standard.

In this way, minute delay faults that were to this point obscured within margins and that were thus undetectable can now be detected. As a result, highly precise defect screening can be achieved.

In the present exemplary embodiment, screening standards are defined for each pattern based on statistical processing of delay data. More specifically, a screening standard is provided at several times the standard deviation of variations according to the chip fabrication yield.

In this way, a variety of distribution-divergent faults can be detected.

At this time, a standard is determined by using the variation of actual chips as the data of the statistical process, whereby highly precise screening can be achieved. In addition, this screening standard can also be estimated in simulations.

Sixth Exemplary Embodiment

Figure 12:
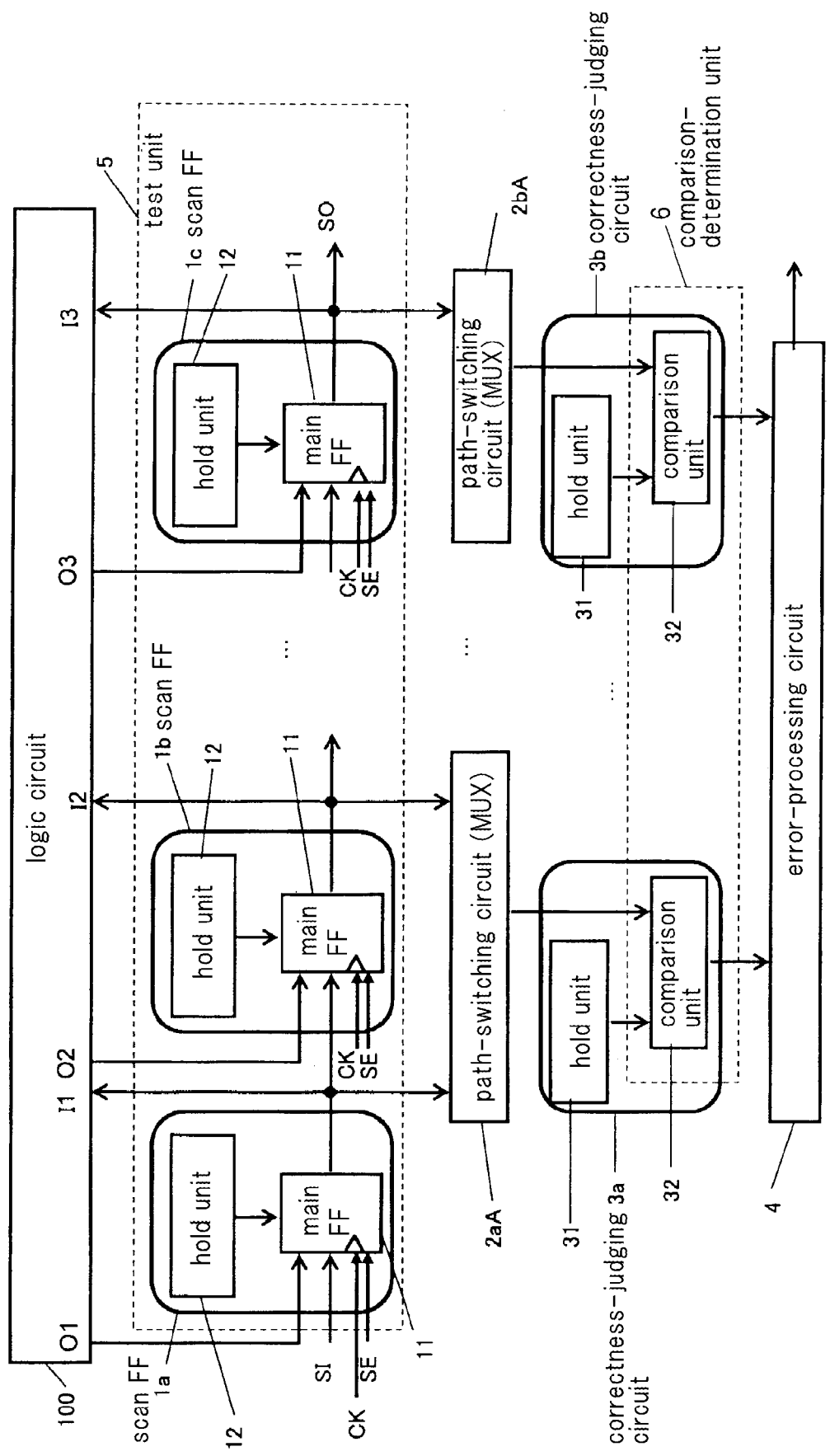
FIG. 12 is an explanatory view for explaining the sixth exemplary embodiment of the present invention.

FIG. 12 shows the sixth exemplary embodiment of the present invention. In FIG. 12, constituent elements identical to those shown in FIG. 1 are given the same reference numbers.

In the sixth exemplary embodiment, path-switching circuit 2aA and 2bA are used in place of signal-processing circuits 2a and 2b.

Path-switching circuit 2aA can also be typically called a switching means. Comparison unit 32 can also be typically called a comparison means. Scan FFs 1a and 1b can also typically be called a specific semiconductor test apparatus. The number of specific semiconductor test apparatuses is not limited to two and may be two or more. Comparison unit 32 corresponds to scan FFs 1a and 1b. One or more comparison units 32 may be included.

For example, when a simple XOR is used as signal-processing circuits 2a and 2b shown in FIG. 1, identifying the scan FF in which an error occurs is problematic. This difficulty arises because XOR that is the signal-processing circuit compresses the information of the output of a plurality of scan FFs, and the scan FF in which an error has occurred cannot be identified from compressed information.

In the sixth exemplary embodiment, path-switching circuit 2aA repeats testing while switching the signal path from scan FFs 1a and 1b to correctness-judging circuit 3a. In other words, path-switching circuit 2aA selectively supplies the output from each output terminal of scan FFs 1a and 1b to correctness-judging circuit 3a.

Although the test time becomes lengthy in this case, the output of scan FFs 1a and 1b can be applied as input to correctness-judging circuit 3a without compressing the output. As a result, the scan FF that has failed can be identified by checking the signal path that was selected when the error was supplied. At the same time, the number of correctness-judging circuits can be decreased to the degree that the number of path selections in path-switching circuit 2aA is increased. As a result, the circuit area can be reduced.

Figure 13:
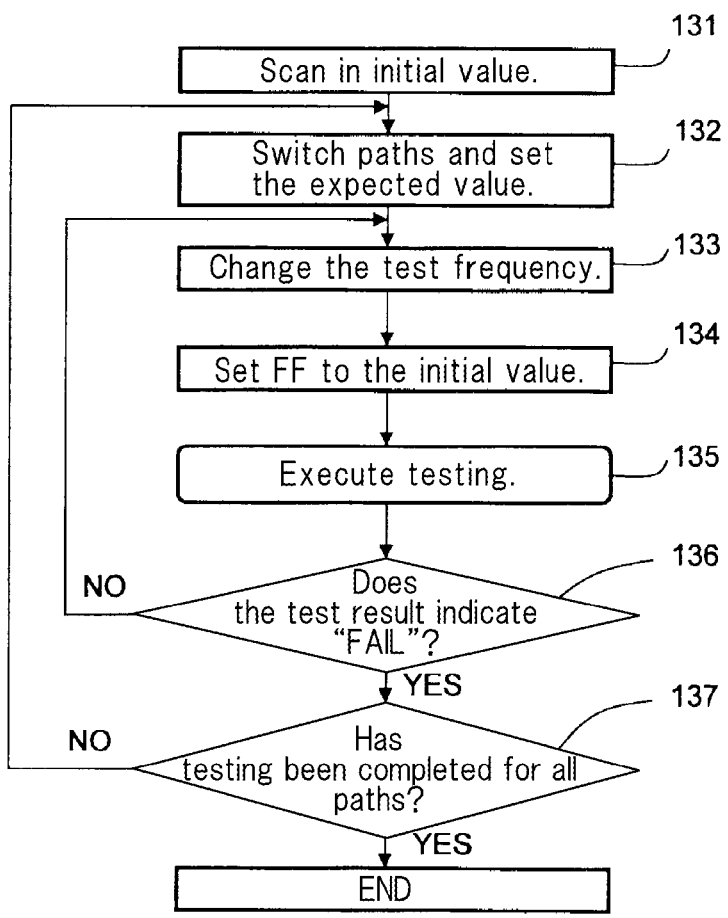
FIG. 13 is a flow chart for explaining the operations of the sixth exemplary embodiment.

FIG. 13 is a flow chart for explaining the operations of the sixth exemplary embodiment.

In the sixth exemplary embodiment, when scan-in is executed regarding the initial value, the initial value is set in the hold unit of each scan FF (Step 131). The method of setting initial values is the same as initial value scan-in of Step 21 shown in FIG. 6.

Path-switching circuit 2aA next selects one path to correctness-judging circuit 3a such that scan FFs 1a or 1b is connected to correctness-judging circuit 3a. The initial value in the hold unit is next set to main FF in each scan FF. Each scan FF and logic circuit 100 are next placed in operation at a frequency (a sufficiently low frequency) that is lower than any of the plurality of predetermined test frequencies, and the operation result is set to hold unit 31 of correctness-judging circuit 3a (Step 132). The operation method of each scan FF and logic circuit 100 is the same as in Steps 22-24 shown in FIG. 6.

The test frequency is next set to any of the plurality of predetermined test frequencies such that the test frequency differs from the currently set frequency (Step 133).

The initial value in the hold unit is next set to main FF in each scan FF (Step 134). The operation of Step 134 is the same as Step 23 shown in FIG. 6.

Testing is next executed at the frequency that was set (Step 135). The operation of Step 135 is the same as Step 24 shown in FIG. 6.

The test is subsequently repeated while changing the test frequency until the test result indicates "Fail" (Steps 132-136).

When the test result indicates "Fail," Step 132 is executed, whereby the selected path is switched, each scan FF and logic circuit 100 is then operated at a frequency (sufficiently low frequency) that is lower than any of the plurality of predetermined test frequencies, and the operation result is set in hold unit 31 of correctness-judging circuit 3a.

Testing is similarly repeated until the test result indicates "Fail." All of logic circuits 100 can be tested by the successive switching of selected paths by path-switching circuit 2aA.

Figure 14:
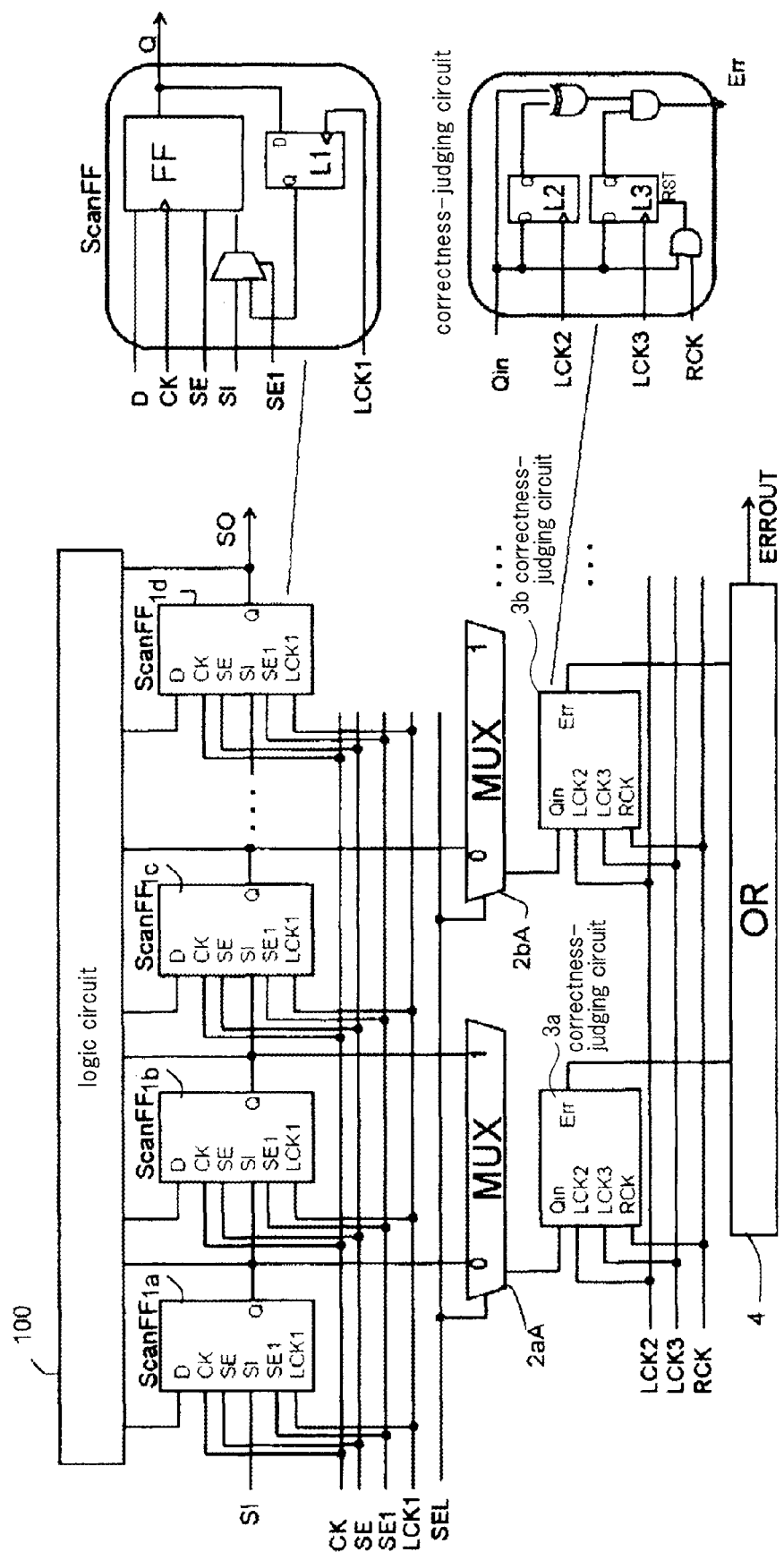
FIG. 14 is an explanatory view showing an example of the circuit of the sixth exemplary embodiment.

FIG. 14 is a circuit diagram of the sixth exemplary embodiment.

In the sixth exemplary embodiment, the entire circuit includes logic circuit 100, scan FFs 1a-1d, path-switching circuits (MUX) 2aA and 2bA, and correctness-judging circuits 3a and 3b.

The signal names and signal functions are basically the same as the scan FF shown in FIG. 5. In the sixth exemplary embodiment, the circuit point that reads the value of latch L1 to a main FF is assumed to be a scan FF, and the circuit point for judging correctness is assumed to be a correctness-judging circuit.

MUX 2aA uses output Q of the plurality of scan FFs and path selection control signal (SEL) as the input signals, selects one signal from among inputs Q according to SEL, and supplies the selected signal to the correctness-judging circuit.

In the circuit diagram of FIG. 14, the outputs of two scan FFs 1a and 1b are applied as input to one correctness-judging circuit 3a while MUX 2aA implements switching. The test flow shown in FIG. 13 can be implemented with few circuit modules by selecting paths according to SEL.

In the present exemplary embodiment, a series of test operations is executed a predetermined number of times in a state in which the output terminal belonging to either one of the plurality of scan FFs 1a and 1b is connected to correctness-judging circuit 3a.

When the series of test operations has been executed the predetermined number of times, the output terminal that is connected to correctness-judging circuit 3a is switched to an output terminal of the output terminals of the plurality of scan FFs 1a and 1b that has still not been connected to correctness-judging circuit 3a, and a switched execution operation in which the series of test operations is again executed one or more times is carried out one or more times.

As a result, the scan FF in which failure occurs can be identified.

In the present exemplary embodiment, the switched execution operation is carried out until all of the output terminals of scan FFs 1a and 1b have been connected to correctness-judging circuit 3a.

As a result, the scan FF of scan FFs 1a and 1b that has failed can be identified.

The defect screening method at the time of shipment of a semiconductor device has been offered as an example of the utilization of each exemplary embodiment.

Although the invention of the present application has been described with reference to each of the exemplary embodiments, the invention of the present application is not limited to the above-described exemplary embodiments. The configuration and details of the invention of the present application are open to various modifications within the scope of the invention of the present application that will be understood by one of ordinary skill in the art.

This application claims priority based on JP-A-2007-340376 for which application was submitted on Dec. 28, 2007 and based on JP-A-2008-244307 for which application was submitted on Sep. 24, 2008 and incorporates all of the disclosures of these applications.

What is claimed is:

1. A semiconductor device comprising:
a test unit having a plurality of semiconductor test apparatuses, wherein each semiconductor test apparatus comprises:
a flip-flop provided with a first input terminal, a second input terminal, a mode terminal configured to accept a mode signal that indicates either a first mode or a second mode, a clock terminal configured to accept a clock signal, and an output terminal;
said flip-flop being configured to select said first input terminal when said mode signal indicates said first mode, select said second input terminal when said mode signal indicates said second mode, and hold information that is being received by the input terminal that was selected based on said mode signal in synchronization with said clock signal and supply said information from said output terminal; and
wherein each semiconductor test apparatus further comprises a hold unit configured to hold a set value and provide the set value to said first input terminal;
wherein the second input terminal of each semiconductor test apparatus being connected to an output terminal in a test-object logic circuit corresponding to the second input terminal, and the output terminal of each semiconductor test apparatus being connected to an input terminal in the test-object logic circuit corresponding to the output terminal; and
a memory unit configured to store information for comparison; and a comparison-determination unit configured to compare information for comparison stored in said memory unit with output from each output terminal in said test unit and configured to supply the result of the comparison as output.

2. The semiconductor device as set forth in claim 1, wherein said information for comparison is an expected operating value.

3. The semiconductor device as set forth in claim 1, wherein:
said comparison-determination unit includes a plurality of comparison units;
each of said plurality of semiconductor test apparatuses corresponds to one of said plurality of comparison units;
each of said plurality of comparison unit compares output of an output terminal in a corresponding semiconductor test apparatus with said information for comparison and supplies the result of the comparison; and
further comprising a determination unit that carries out error determination based on the result of comparison from each of said plurality of comparison unit.

4. The semiconductor device as set forth in claim 1, wherein:
said comparison-determination unit includes at least one comparison unit that corresponds to two or more specific semiconductor test apparatuses among said plurality of semiconductor test apparatuses;
said semiconductor device further includes a switching unit that alternatively provides to said comparison unit output from the output terminal of each specific semiconductor test apparatus; and
said comparison unit compares output from the output terminal in each said specific semiconductor test apparatus with said information for comparison and supplies the result of the comparison.

5. The semiconductor device as set forth in claim 3, wherein each of said plurality of comparison unit corresponds one-to-one to one of said plurality of semiconductor test apparatuses.

6. The semiconductor device as set forth in claim 1, further comprising:
a memory unit that stores information for output control; and
a control unit that, based on information for output control in said memory means, switches between a state in which the result of said comparison from said comparison-determination unit is supplied as output and a state in which a predetermined value is supplied as output.

7. The semiconductor device as set forth in claim 6, wherein said information for output control indicates whether or not the output of said semiconductor test apparatus is in an indefinite state.

8. The semiconductor device as set forth in claim 6, further including an updating unit that, based on the result of said comparison from said comparison-determination unit, updates the information for output control in said memory unit.

9. The semiconductor device as set forth in claim 1, further including a providing unit that provides the result of said comparison from said comparison-determination unit to said first input terminal at any timing.

10. A test method that uses a test apparatus having a plurality of semiconductor test apparatuses, wherein each semiconductor test apparatus comprises:
a flip-flop provided with a first input terminal, a second input terminal, a mode terminal configured to accept a mode signal that indicates either a first mode or a second mode, a clock terminal configured to accept a clock signal, and an output terminal;
said flip-flop being configured to select said first input terminal when said mode signal indicates said first mode, select said second input terminal when said mode signal indicates said second mode, and hold information that is being received by the input terminal that was selected based on said mode signal in synchronization with said clock signal and supply said information from said output terminal; and
a hold unit configured to hold a set value and provide the set value to said first input terminal;
the second input terminal of each semiconductor test apparatus being connected to an output terminal in a test-object logic circuit that corresponds to the second input terminal, and the output terminal of each semiconductor test apparatus being connected to an input terminal in the test-object logic circuit that corresponds to the output terminal; said test method carrying out a plurality of times a series of operations of:
providing a clock signal to said clock terminal in a state in which a mode signal that indicates said first mode is supplied to said mode terminal in said plurality of semiconductor test apparatuses; and then, in a state in which a mode signal that indicates said second mode is provided to said mode terminal, providing a clock signal two times to said clock terminal and supplying the test result from said output terminal.

11. The test method as set forth in claim 10, wherein:

said series of operations is executed a predetermined number of times in a state wherein the output terminal belonging to any one of said plurality of semiconductor test apparatuses is connected to a correctness-judging circuit; and a switched execution operation is carried out one or more times wherein, when said series of operations has been executed said predetermined number of times, the output terminal that is connected to said correctness-judging circuit is switched to, among output terminals of each of said semiconductor test apparatuses, an output terminal that has still not been connected to said correctness-judging circuit and said series of operations is again executed one or more times.

12. The test method as set forth in claim 11, wherein said switched execution operation is carried out until all of the output terminals of each of said semiconductor test apparatuses have been connected to said correctness-judging circuit.

13. A semiconductor test unit comprising:

a plurality of flip-flops each of which is provided with a first input terminal, a second input terminal, a mode terminal configured to accept a mode signal that indicates either a first mode or a second mode, a clock terminal configured to accept a clock signal, and an output terminal;

wherein each of said plurality of flip-flops is configured to select said first input terminal when said mode signal indicates said first mode, select said second input terminal when said mode signal indicates said second mode, and hold information that is being received by the input terminal that was selected based on said mode signal in synchronization with said clock signal and supply said information from said output terminal; and a plurality of hold units, each of said plurality of hold units being associated with a respective one of said plurality of flip-flops, and each of said plurality of hold units being configured to hold a set value and provide the set value to said first input terminal of respective flip-flop.

14. The semiconductor test unit as set forth in claim 13, wherein said set value is an initial value for testing.

* * * * *

UNITED STATES PATENT AND TRADEMARK OFFICE
CERTIFICATE OF CORRECTION

PATENT NO. : 8,441,277 B2  Page 1 of 1
APPLICATION NO. : 12/810877
DATED : May 14, 2013
INVENTOR(S) : Noguchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 368 days.

Signed and Sealed this
Eighth Day of September, 2015

Michelle K. Lee
*Director of the United States Patent and Trademark Office*